(12) United States Patent
Hilali et al.

(10) Patent No.: US 8,257,995 B2
(45) Date of Patent: *Sep. 4, 2012

(54) MICROWAVE ANNEAL OF A THIN LAMINA FOR USE IN A PHOTOVOLTAIC CELL

(75) Inventors: Mohamed M Hilali, Sunnyvale, CA (US); Venkatesan Murali, Santa Clara, CA (US); Gopal Prabhu, San Jose, CA (US); Zhiyong Li, San Jose, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 326 days.

This patent is subject to a terminal disclaimer.

(21) Appl. No.: 12/636,704

(22) Filed: Dec. 11, 2009

(65) Prior Publication Data

US 2011/0143480 A1    Jun. 16, 2011

(51) Int. Cl.
  H01L 21/00   (2006.01)
  H01L 21/30   (2006.01)
  H01L 21/46   (2006.01)
  H01L 21/78   (2006.01)
  H01L 21/301  (2006.01)

(52) U.S. Cl. ............ 438/58; 438/57; 438/455; 438/464

(58) Field of Classification Search .................. 438/58, 438/57, 458, 455, 464, 479, 480, 517, 149, 438/151, 153, 154, 163
See application file for complete search history.

(56) References Cited

U.S. PATENT DOCUMENTS

| | | | |
|---|---|---|---|
| 5,985,742 A | 11/1999 | Henley et al. | |
| 6,172,322 B1 | 1/2001 | Shang et al. | |
| 7,579,654 B2 * | 8/2009 | Couillard et al. | 257/347 |
| 7,842,585 B2 * | 11/2010 | Sivaram et al. | 438/460 |
| 7,858,430 B2 * | 12/2010 | Hilali et al. | 438/72 |
| 2009/0194162 A1 | 8/2009 | Sivaram et al. | |

OTHER PUBLICATIONS

Bykov, Yu V,, A. G. Eremeev, V. Holoptsev, I. Plotnikov, and N. Zharova, "Spike Annealing of Silicon Wafers Using Millimeter-Wave Power," 9th International Conference on Advanced Thermal Processing of Semiconductors-RTP 2001, pp. 232-239.

Bykov, Yu. V,, A. G. Eremeev, N. A. Zharova, I. V. Plotnikov, K. I. Rybakov, M. N. Drozdov, Yu. N. Drozdov, and V. D. Skupov, "Diffusion Processes in Semiconductor Structures During Microwave Annealing," Radiophysics and Quantum Electronics, vol. 46, Nos. 8-9, 2003.

Choi, Yong Woo, Jeong No Lee, Tae Woong Jang, and Byung Tae Ahn, "Thin-Film Transistors Fabricated with Poly-Si Films Crystallized at Low Temperature by Microwave Annealing" IEEE Electron Device Letters, vol. 20, No. 1, Jan. 1999, pp. 2-4.

Clark, David E. and Willard H. Sutton, "Microwave Processing of Materials," Annu. Rev. Mater. Sci. 1996. 26:299-331.

(Continued)

*Primary Examiner* — Chuong A. Luu
(74) *Attorney, Agent, or Firm* — The Mueller Law Office

(57) ABSTRACT

A cleave plane is defined in a semiconductor donor body by implanting ions into the wafer. A lamina is cleaved from the donor body, and a photovoltaic cell is formed which comprises the lamina. The implant may cause some damage to the crystal structure of the lamina. This damage can be repaired by annealing the lamina using microwave energy. If the lamina is bonded to a receiver element, the receiver element may be either transparent to microwaves, or may reflect microwaves, while the semiconductor material absorbs the microwaves. In this way the lamina can be annealed at high temperature while the receiver element remains cooler.

23 Claims, 9 Drawing Sheets

OTHER PUBLICATIONS

Fong, S. C., C. Y. Wang, T. H. Chang and T. S. Chin, "Crystallization of Amorphous Si Film by Microwave Annealing with SiC Sceptors," Applied Physics Letters, vol. 94, pp. 102104-1.

Gardner, J. A., M. V. Rao, Y. L. Tian, O. W. Holland, G. Kelner, J. A. Freitas, Jr., and I. Ahmad, "Microwave Annealing of Ion Implanted 6H-SiC," MRS Proceedings, May 1996.

Kazor, A and I.W. Boyd, "Ozone Oxidation of Silicon," Electronics Letters, Jan. 7, 1993, vol. 29, No. 1, pp. 115-116.

Kowalski, Jeff M., and Jeff E. Kowalski, "Microwave Annealing for Low Temperature Activation of As in Si," 15th IEEE International Conference on Advanced Thermal Processing of Semiconductors, 2007.

Lee, Jeong No, Yoon Chang Kim, Yong Woo Choi, and Byung Tae Ahn, "Low-Temperature Crystallization of Amorphous Silicon Thin Films by Microwave Heating," Materials Research Society Symposium Proceedings, vol. 471, 1997, pp. 173-178.

Lee, J.K., M. Nastasi, N. David Theodore, A. Smalley, T.L. Alford, J.W. Mayer, M. Cai, and S.S. Lau, "Effects of hydrogen implantation temperature on ion-cut of silicon," Journal of Applied Physics, vol. 96, No. 1, Jul. 1, 2004, pp. 280-288.

Lee, Yao-Jen, Fu Kuo Hsueh, Shih-Chiang Huang, Jeff M. Kowalski, Jeff E. Kowalski, Alex T. Y. Cheng, Ann Koo, Guang-Li-Luo and Ching-Yi Wu "A Low-Temperature Microwave Anneal Process for Boron-Doped Ultrathin Ge Epilayer on Si Substrate," IEEE Electron Device Letters, vol. 30, No. 2, Feb. 2009, pp. 123-125.

Lojek, B and H.D. Geiler, "Investigation of microwave annealed implanted layers with TWIN metrology system," 16th IEEE International Conference on Advanced Thermal Processing of Semiconductors, RTP-2008.

Park, C-M and J-H Jeon, C-H Kim, and M-K Han, "A Dehydration Annealing Method of A-Si by Microwave", Materials Research Society Symposium Proceedings, vol. 508, 1998, pp. 115-119.

Thompson, D. C., J. Decker, T. L. Alford, J. W. Mayer, and N. David Theodore, "Microwave Activation of Dopants and Solid Phase Epitaxy in Silicon," Materials Research Society Symposium Proceedings, vol. 989, 2007, pp. 0989-A06-18.

Thompson, D. C., T. L. Alford, J. W. Mayer, T. HöChbauer, J. K. Lee, M. Nastasi, and N. David Theodore, "Microwave Activation of Exfoliation in Ion-Cut Silicon Layer Transfer," Material Research Society Symposium Proceedings, vol. 994, 2007, pp. 0994-F11-07.

Thompson, D. C., T. L. Alford, J. W. Mayer, T. Hochbauer, J. K. Lee, M. Nastasi, S. S. Lau, N. David Theodore, and Paul K. Chu, "Microwave enhanced ion-cut silicon layer transfer" Journal of Applied Physics, vol. 101, 2007, pp. 114915.

Thompson, Keith, John H. Bookse, R. F. Cooper, and Y. B. Gianchandani, "Electromagnetic Induction Heating for the 70 nm Node," Materials Research Society Symposium Proceedings vol. 717, 2002, pp. C.1.3.1-C.1.3.6.

Thompson, Keith, John H. Booske, R.L. Ives, John Lohr, Yurii A. Gorelov, Ken Kajiwara, "Millisecond Microwave Annealing: Reaching the 32 nm Node," Materials Research Society Symposium Proceedings, vol. 810, 2004, C5.3.1-05.3.6.

Lee, T.H.,C.H. Huang,Y.Y.Yang, P.W. Li, T. Suryasindhu, and S. Lee, "Fabrication of a Nanoscale Single-Crystalline Silicon Thin Film on Insulator", Electrochemical and Solid-State Letters, vol. 10 (7) 2007 pp. K17-K19.

* cited by examiner

MICROWAVE ANNEAL OF A THIN LAMINA FOR USE IN A PHOTOVOLTAIC CELL

BACKGROUND OF THE INVENTION

The invention relates to a method to use microwave energy to anneal a thin semiconductor lamina for use in a photovoltaic cell.

Crystalline damage in semiconductor material such as silicon can be repaired by various means. One of the simplest ways is to subject the silicon body to a high-temperature anneal. In some circumstances, however, a thermal anneal may present difficulties, as when other materials are present that cannot tolerate the anneal temperature.

SUMMARY OF THE PREFERRED EMBODIMENTS

The present invention is defined by the following claims, and nothing in this section should be taken as a limitation on those claims. In general, the invention is directed to a method to anneal a semiconductor lamina using microwave energy.

A first aspect of the invention provides for a method to form a photovoltaic cell, the method comprising the steps of: providing a semiconductor lamina bonded to a receiver element, the lamina having a first surface and a second surface opposite the first, the thickness between the first surface and the second surface between about 1.5 microns and about 10 microns, wherein the lamina is bonded to the receiver element at the first surface, with zero, one, or more layers intervening, and the second surface is exposed, and wherein the receiver element has a thickness of at least 80microns; and annealing the entire thickness of the bonded lamina with microwave energy, wherein the lamina is suitable for use in the photovoltaic cell, and wherein the photovoltaic cell comprises the lamina.

Another aspect of the invention provides for a method to form a photovoltaic cell, the method comprising the steps of: defining a cleave plane in a substantially crystalline semiconductor donor wafer; bonding the donor wafer at a first surface to a receiver element; cleaving a substantially crystalline semiconductor lamina from the donor wafer at the cleave plane, wherein the lamina remains bonded to the receiver element at the first surface and a second surface of the lamina is created by cleaving, the second surface opposite the first, and wherein the lamina has a thickness of at least 2 microns; and annealing the entire thickness of the bonded lamina with microwave energy to repair crystalline defects, wherein the lamina is suitable for use in the photovoltaic cell, the photovoltaic cell comprising the lamina.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
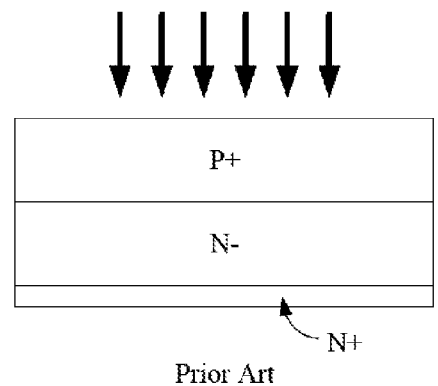
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n− junction (as shown in FIG. 1) or a n+/p− junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
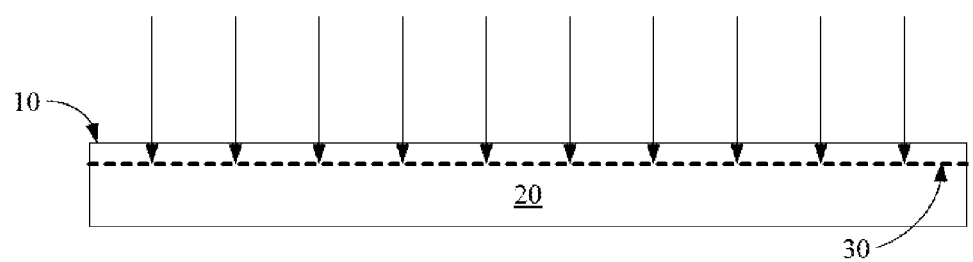
FIGS. 2a-2d are cross-sectional views of stages of fabrication of a photovoltaic cell formed according to an embodiment of U.S. patent application Ser. No. 12/026530.
Figure 2B:
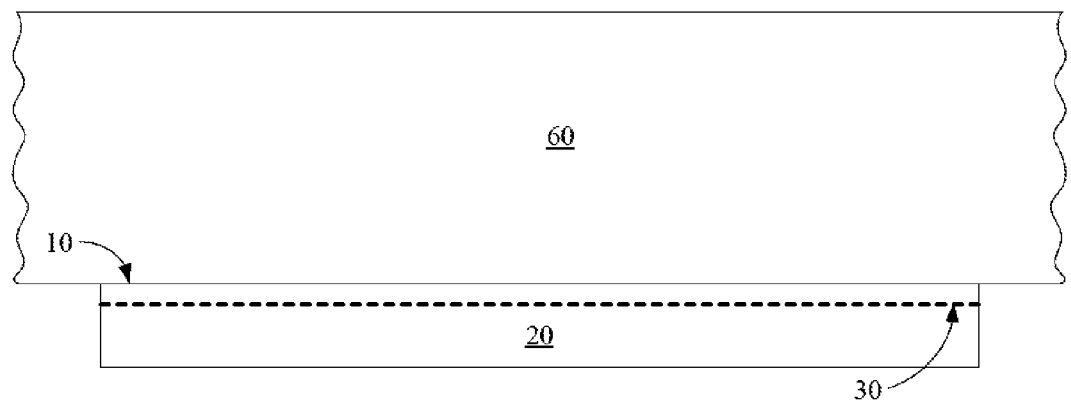
Figure 2C:
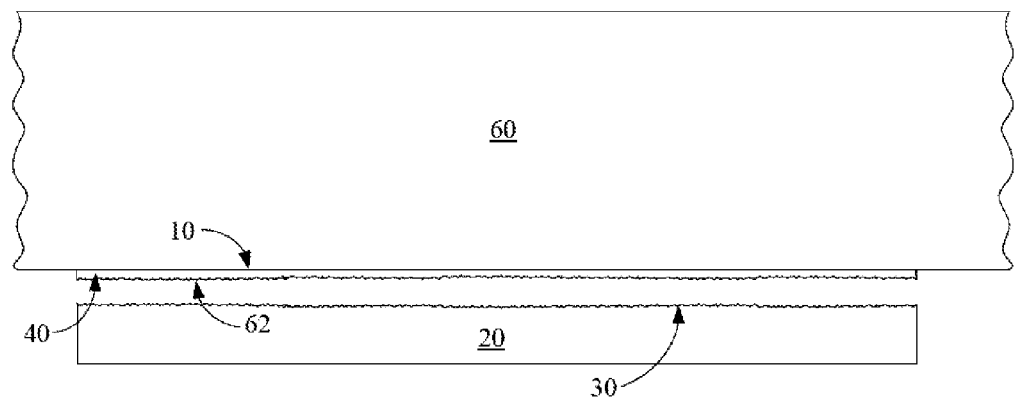
Figure 2D:
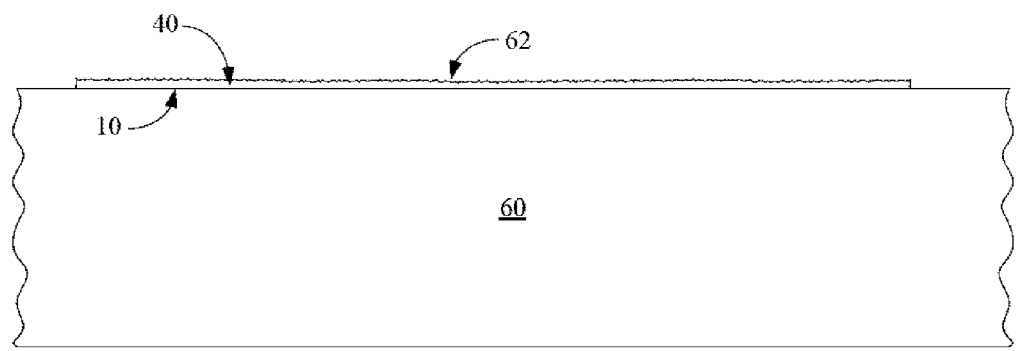

Sivaram et al., U.S. patent application Ser. No. 12/026530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Using the methods of Sivaram et al., photovoltaic cells, rather than being formed from sliced wafers, are formed of thin semiconductor laminae without wasting silicon through excessive kerf loss or by fabrication of an unnecessarily thick cell, thus reducing cost. The same donor wafer can be reused to form multiple laminae, further reducing cost, and may be resold after exfoliation of multiple laminae for some other use.

The implant step, during which ions are implanted through the thickness of semiconductor material which will ultimately become the lamina, may cause damage to the crystal structure of the lamina. This damage reduces the efficiency of the cell. Localized damage at the new lamina surface created by exfoliation can be removed by various surface treatments, for example by etching. Removing damage that extends through the entire thickness of the lamina, however, is more problematic.

The present invention provides a method to selectively anneal a semiconductor body without heating adjacent materials to the same high temperature. Thus, materials that cannot tolerate a high anneal temperature are protected from heat damage. In the present invention, damage to the crystal structure of the lamina is repaired by annealing the lamina using microwave radiation. Microwave energy is absorbed by the semiconductor material of the lamina, generating heat within the body of the lamina and annealing it. The receiver element, if it is made of a different material, will respond differently to microwave energy. The receiver element may be of various materials, including, for example, glass, ceramic, metallurgical-grade silicon, or metal. Glass and most ceramics are transparent to microwaves; thus microwave energy will pass through a glass or ceramic receiver element without directly heating it. In some embodiments, a metal layer or stack, which may serve to reflect light in the completed device, is formed between the lamina and the receiver element. This metal layer may reflect microwaves back through the lamina, increasing absorption of microwave energy, and shielding the receiver element from some or all microwave energy. A metal receiver element may also reflect rather than absorb microwaves.

During a traditional thermal anneal in a furnace, the lamina and the receiver element are heated to essentially the same temperature. In contrast, microwave energy is absorbed by the lamina, heating it to a temperature sufficient to cure crystal defects, while microwaves pass through, or are reflected from, the receiver element; thus the receiver element may be substantially cooler. A furnace anneal to repair crystal damage may be performed at temperatures from 600 to 1000 degrees C. Annealing at temperatures exceeding, for example, about 900 degrees C. can be most effective. Not all materials can readily tolerate temperatures this high, however. By lowering the temperature experienced by the receiver element, the range of materials that can be used for the receiver element is increased. Some less temperature-tolerant materials may be advantageous for a variety of reasons; for example they may be less expensive. In some embodiments, a microwave anneal may be combined with a heating step, allowing the heating step to be performed at a lower temperature, for a shorter time, or both, than if it were performed without the application of microwave energy.

To summarize, what is described is a method to form a photovoltaic cell, the method comprising the steps of: providing a semiconductor lamina bonded to a receiver element, the lamina having a first surface and a second surface opposite the first, the thickness between the first surface and the second surface between about 1.5 microns and about 10 microns, wherein the lamina is bonded to the receiver element at the first surface, with zero, one, or more layers intervening, and the second surface is exposed, and wherein the receiver element has a thickness of at least 80 microns; and annealing the entire thickness of the bonded lamina with microwave energy, wherein the lamina is suitable for use in the photovoltaic cell, and wherein the photovoltaic cell comprises the lamina.

For clarity, a detailed example of a photovoltaic assembly including a receiver element and a lamina having thickness between 0.2 and 100 microns, in which the lamina is annealed with microwave energy, will be provided. For completeness, many materials, conditions, and steps will be described. It will be understood, however, that many of these details can be modified, augmented, or omitted while the results fall within the scope of the invention.

EXAMPLE

Anneal To Cure Crystal Defects

The process begins with a donor body of an appropriate semiconductor material. An appropriate donor body may be a monocrystalline silicon wafer of any practical thickness, for example from about 200 to about 1000 microns thick. Typically the wafer has a <100> orientation, though wafers of other orientations may be used. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 3A:
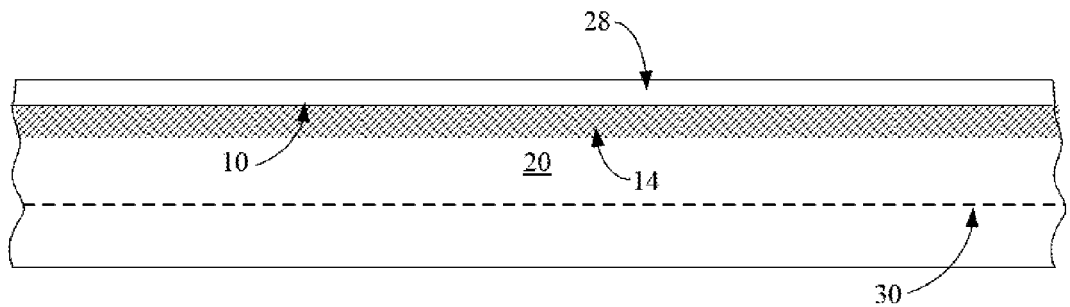
FIGS. 3a-3f are cross-sectional views showing stages of fabrication of a photovoltaic cell formed according to an embodiment of the present invention.

Referring to FIG. 3a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1\times10^{15}$ and about $1\times10^{18}$ dopant atoms/cm$^3$, for example about $1\times10^{17}$ dopant atoms/cm$^3$. Donor wafer 20 may be, for example, solar- or semiconductor-grade silicon.

First surface 10 of donor wafer 20 may be substantially planar, or may have some preexisting texture. If desired, some texturing or roughening of first surface 10 may be performed, for example by wet chemical or plasma treatment. Surface roughness may be random or may be periodic, as described in "Niggeman et al., "Trapping Light in Organic Plastic Solar Cells with Integrated Diffraction Gratings," Proceedings of the 17$^{th}$ European Photovoltaic Solar Energy Conference, Munich, Germany, 2001. Methods to create surface roughness are described in further detail in Petti, U.S. patent application Ser. No. 12/130,241, "Asymmetric Surface Texturing For Use in a Photovoltaic Cell and Method of Making," filed May 30, 2008; and in Herner, U.S. patent application Ser. No. 12/343,420, "Method to Texture a Lamina Surface Within a Photovoltaic Cell," filed Dec. 23, 2008, both owned by the assignee of the present application and both hereby incorporated by reference.

First surface 10 may be heavily doped to some depth to the same conductivity type as wafer 20, forming heavily doped region 14; in this example, heavily doped region 14 is n-type. As wafer 20 has not yet been affixed to a receiver element, high temperatures can readily be tolerated at this stage of fabrication, and this doping step can be performed by any conventional method, including diffusion doping. Any conventional n-type dopant may be used, such as phosphorus or arsenic. Dopant concentration may be as desired, for example at least $1\times10^{18}$ dopant atoms/cm$^3$, for example between about $1\times10^{18}$ and $1\times10^{21}$ dopant atoms/cm$^3$. Doping and texturing can be performed in any order, but since most texturing methods remove some thickness of silicon, it may be preferred to form heavily doped n-type region 14 following texturing. Heavily doped region 14 will provide electrical contact to the base region in the completed device.

Next, in the present embodiment, a dielectric layer 28 is formed on first surface 10. As will be seen, in the present example first surface 10 will be the back of the completed photovoltaic cell, and a conductive material is to be formed on the dielectric layer. The reflectivity of the conductive layer to be formed is enhanced if dielectric layer 28 is relatively thick. For example, if dielectric layer 28 is silicon dioxide, it may be between about 1000 and about 1500 angstroms thick, while if dielectric layer 28 is silicon nitride, it may be between about 700 and about 800 angstroms thick, for example about 750 angstroms. This layer may be grown or deposited by any suitable method. A grown oxide or nitride layer 28 passivates first surface 10 better than if this layer is deposited. In some embodiments, a first thickness of dielectric layer 28 may be grown, while the rest is deposited.

In the next step, ions, preferably hydrogen or a combination of hydrogen and helium, are implanted into wafer 20 to define cleave plane 30, as described earlier. This implant may be performed using the implanter described in Parrill et al., U.S. patent application Ser. No. 12/122108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009, all owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 or 6 microns.

Figure 3B:
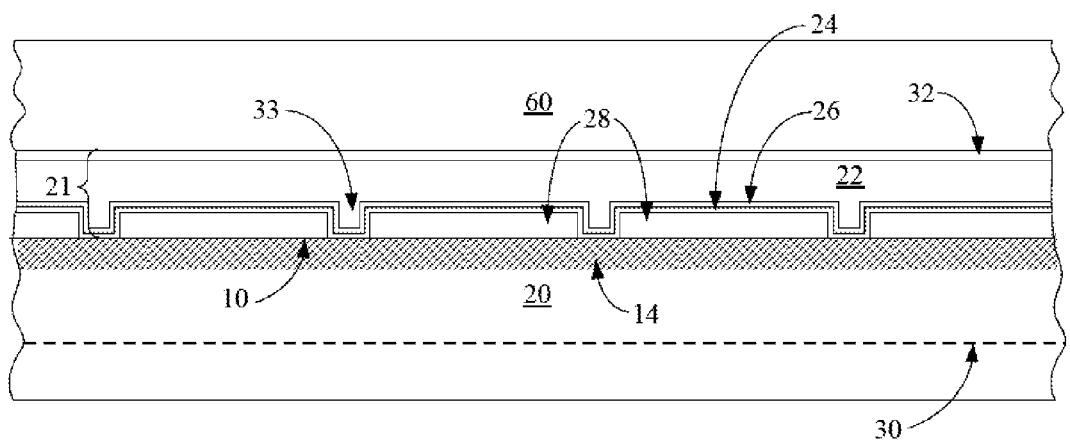

Turning to FIG. 3*b*, after implant, openings 33 are formed in dielectric layer 28 by any appropriate method, for example by laser scribing or screen printed etchant paste. The size of openings 33 may be as desired, and will vary with dopant concentration, metal used for contacts, etc. In one embodiment, these openings may be about 40 microns square. Note that figures are not to scale.

A titanium layer 24 is formed on dielectric layer 28 by any suitable method, for example by sputtering or thermal evaporation. This layer may have any desired thickness, for example between about 20 and about 2000 angstroms, in some embodiments about 300 angstroms thick or less, for example about 100 angstroms. Layer 24 may be titanium or an alloy thereof, for example, an alloy which is at least 90 atomic percent titanium. Titanium layer 24 is in immediate contact with first surface 10 of donor wafer 20 in vias 33; elsewhere it contacts dielectric layer 28. In alternative embodiments, dielectric layer 28 is omitted, and titanium layer 24 is formed in immediate contact with donor wafer 20 at all points of first surface 10.

Non-reactive barrier layer 26 is formed on and in immediate contact with titanium layer 24. This layer is formed by any suitable method, for example by sputtering or thermal evaporation. Non-reactive barrier layer 26 may be any material, or stack of materials, that will not react with silicon, is conductive, and will provide an effective barrier to the low-resistance layer to be formed in a later step. Suitable materials for non-reactive barrier layer include TiW, TiN, W, Ta, TaN, TaSiN, Ni, Mo, Zr, or alloys thereof. The thickness of non-reactive barrier layer 26 may range from, for example, between about 100 and about 10,000 angstroms. In some embodiments this layer is about 1000 angstroms thick.

Low-resistance layer 22 is formed on non-reactive barrier layer 26. This layer may be, for example, silver, cobalt, or tungsten or alloys thereof. In this example low-resistance layer 22 is silver or an alloy that is at least 90 atomic percent silver, formed by any suitable method. Silver layer 22 may be between about 5000 and about 100,000 angstroms thick, for example about 20,000 angstroms (2 microns) thick.

In this example an adhesion layer 32 is formed on low-resistance layer 22. Adhesion layer 32 is a material that will adhere to receiver element 60, for example titanium or an alloy of titanium, for example an alloy which is at least 90 atomic percent titanium. In alternative embodiments, adhesion layer 32 can be a suitable dielectric material, such as Kapton or some other polyimide. In some embodiments, adhesion layer 32 is between about 100 and about 5000 angstroms, for example about 400 angstroms.

In alternative embodiments, some of the layers making up intermetal stack 21, such as adhesion layer 32 and low-resistance layer 22, could be deposited on receiver element 60 instead of on donor wafer 20.

Next, wafer 20 is affixed to a receiver element 60, with dielectric layer 28, titanium layer 24, non-reactive barrier layer 26, low-resistance layer 22, and adhesion layer 32 intervening. Receiver element 60 may be any suitable material, including glass, such as soda-lime glass or borosilicate glass; a metal or metal alloy such as stainless steel or aluminum; a polymer such as a polyimide; a ceramic; or a semiconductor, such as metallurgical grade silicon. Receiver element 60 may be a laminate structure, including layers of different materials. In general, receiver element 60 will be at least 80 microns thick, for example 200 microns thick or more. The wafer 20, receiver element 60, and intervening layers are bonded by any suitable method, for example by anodic bonding. In some embodiments, receiver element 60 has a widest dimension no more than about twenty percent greater than the widest dimension of wafer 20, and in most embodiments the widest dimension may be about the same as that of wafer 20. In other embodiments, receiver element 60 is significantly larger than wafer 20, and additional donor wafers may be bonded to the same receiver element.

Figure 3C:
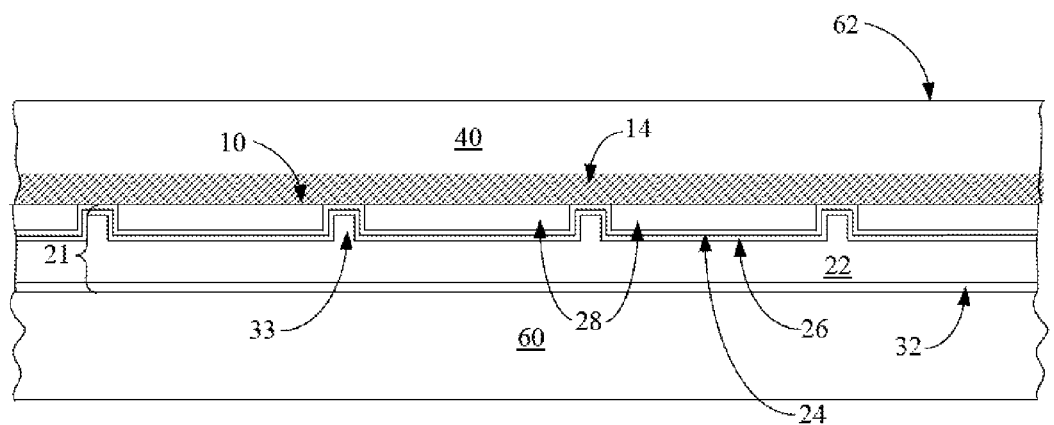

Referring to FIG. 3c, which shows the structure inverted with receiver element 60 on the bottom, a thermal step causes lamina 40 to cleave from the donor wafer at the cleave plane. In some embodiments, this cleaving step may be combined with a bonding step. Cleaving is achieved in this example by exfoliation, which may be achieved at temperatures between, for example, about 350 and about 650 degrees C. In general, exfoliation proceeds more rapidly at higher temperature. In some embodiments, exfoliation may be achieved using a microwave anneal, or a microwave treatment combined with a furnace anneal. The thickness of lamina 40 is determined by the depth of cleave plane 30. In many embodiments, the thickness of lamina 40 is between about 1 and about 10 microns, for example between about 2 and about 5 microns, for example about 4.5 microns. Bonding and exfoliation may be achieved using methods described in Agarwal et al., U.S. patent application Ser. No. 12/335,479, "Methods of Transferring a Lamina to a Receiver Element," filed Dec. 15, 2008, owned by the assignee of the present application and hereby incorporated by reference.

During relatively high-temperature steps, such as the exfoliation of lamina 40, the portions of titanium layer 24 in immediate contact with silicon lamina 40 will react to form titanium silicide. If dielectric layer 28 was included, titanium silicide is formed where first surface 10 of lamina 40 was exposed in vias 33. If dielectric layer 28 was omitted, in general all of the titanium of titanium layer 24 will be consumed, forming a blanket of titanium silicide.

Second surface 62 has been created by exfoliation. Second surface 62 will typically have some damage, and steps may be taken to remove or repair this damage. Some damage may be removed by wet etching, for example with KOH or TMAH. Some thickness of silicon will be removed by this etch, for example between about 3000 to 7000 angstroms or more. In general a deeper implant (resulting in a thicker lamina) will have a thicker damaged zone to be removed. An etch step intended to create some texture at this surface to increase internal reflection may be combined with the damage-removal etch, or may be performed independently. One option, for example, is the self-limiting etch described by Clark et al., U.S. patent application Ser. No. 12/484271, "Selective Etch For Damage Removal at Exfoliated Surface," filed Jun. 15, 2009, owned by the assignee of the present application and hereby incorporated by reference.

At this point lamina 40 may be exposed to a microwave anneal to repair point defects within the body of the lamina. Microwave energy may have wavelength ranging from 1 mm to 1 m. The frequency may be, for example, 2.45 GHz. The power of the microwave may be, for example, between about 100 watts and about 6000 watts, for example between about 500 and about 5000 watts, in some embodiments between about 1000 and about 1500 watts.

Figure 3D:
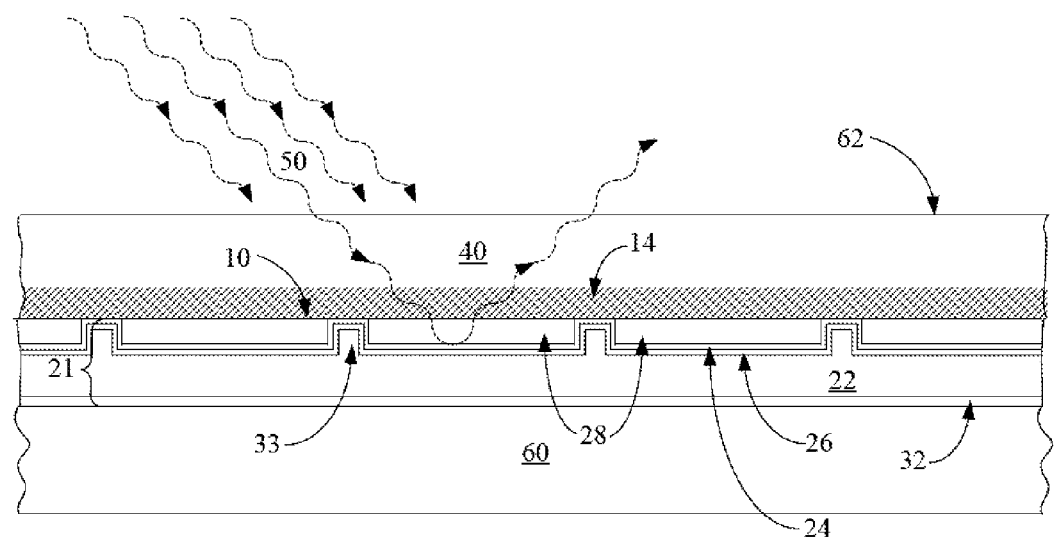

Turning to FIG. 3d, in one embodiment microwaves may be applied from a microwave source from an angle, as in the figure, or from directly above. The lamina-receiver element assembly may be rotated or otherwise moved during microwave treatment or may be stationary; likewise, the microwave source may be scanning If receiver element 60, or some layer in the stack between receiver element 60 and lamina 40, is formed of metal, or some other reflective material, that layer may reflect microwaves. In this case, some incident microwaves 50 will be absorbed by the lamina 40, and the microwaves that reach the reflective layer will be reflected back into lamina 40. In the example just described, microwaves will be reflected from titanium layer 24, titanium nitride layer 26, and/or silver layer 22, as shown in FIG. 3d. If the metal layer or stack is relatively thick, little or no microwave energy is expected to reach receiver element 60. A thinner layer or stack, perhaps thousands of angstroms, will reflect some but not all microwave energy, reducing the amount that reaches receiver element 60.

The microwaves may be applied for any suitable amount of time, for example from a few seconds through thirty to forty minutes, for example from two to five minutes. The microwaves may be continuous or pulsed. The microwave anneal may be combined with a thermal anneal. For example, microwave annealing may be performed while the lamina 40 and receiver element 60, and associated layers, are heated to about 200 degrees C. In other embodiments, microwave annealing may be performed without heating the lamina and receiver element assembly. Microwave energy enters lamina 40 at second surface 62, and penetrates its entire thickness. The lamina may be, for example 1 to 20 microns thick, for example 1 to 10 microns thick, for example 1 to 5 microns thick, for example 4 microns thick. In most embodiments, then, microwave energy, is absorbed at a depth of at least 2, or at least 4 microns beneath second surface 62. In some embodiments, all or a portion of the microwave anneal may be performed in an ambient of hydrogen or forming gas. The hydrogen may serve to passivate interstitial defects.

Figure 3E:
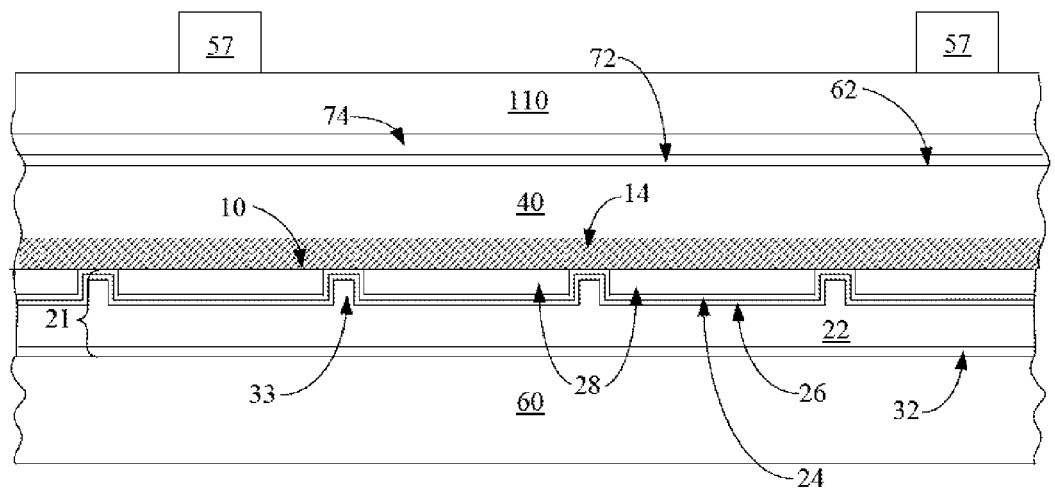

Referring to FIG. 3e, if any native oxide (not shown) has formed on second surface 62, it may be removed by any conventional cleaning step, for example by etching in dilute hydrofluoric acid. The surface can optionally be passivated by microwave decomposition of ozone at second surface 62 to form a thin oxide (not shown), for example about 15 to about 30 angstroms thick. This layer is thin enough to allow tunneling of charge carriers, and need not be removed.

Next, a silicon layer is deposited on second surface 62, directly on the passivating oxide, if formed. This layer 74 includes heavily doped silicon, and may be amorphous, microcrystalline, nanocrystalline, or polycrystalline silicon, or a stack including any combination of these. This layer or stack may have a thickness, for example, between about 100 and about 350 angstroms. FIG. 3e shows an embodiment that includes intrinsic amorphous silicon layer 72 between second surface 62 and doped layer 74. In other embodiments, layer 72 may be omitted. In this example, heavily doped silicon layer 74 is doped p-type, opposite the conductivity type of lightly doped n-type lamina 40, and serves as the emitter of the photovoltaic cell being formed, while lightly doped n-type lamina 40 comprises the base region. If included, layer 72 is sufficiently thin that it does not impede electrical connection between lamina 40 and doped silicon layer 74.

A transparent conductive oxide (TCO) layer 110 is formed on heavily doped silicon layer 74. Appropriate materials for TCO 110 include indium tin oxide, as well as aluminum-doped zinc oxide, tin oxide, titanium oxide, etc.; this layer may be, for example, about 1000 angstroms thick, and serves as both a top electrode and an antireflective layer. In alternative embodiments, an additional antireflective layer (not shown) may be formed on top of TCO 110.

A photovoltaic cell has been formed, including lightly doped n-type lamina 40, which comprises the base of the cell, and heavily doped p-type amorphous silicon layer 74, which serves as the emitter of the cell. Heavily doped n-type region 14 will improve electrical contact to the cell. Electrical contact must be made to both faces of the cell. This contact can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference. If the methods of the '064 application are employed, for example, gridlines 57 (formed by any suitable method) make electrical contact to heavily doped p-type amorphous silicon layer 74 by way of TCO 110, while contact is made to the base of the cell by way of heavily doped n-type layer 14.

Figure 3F:
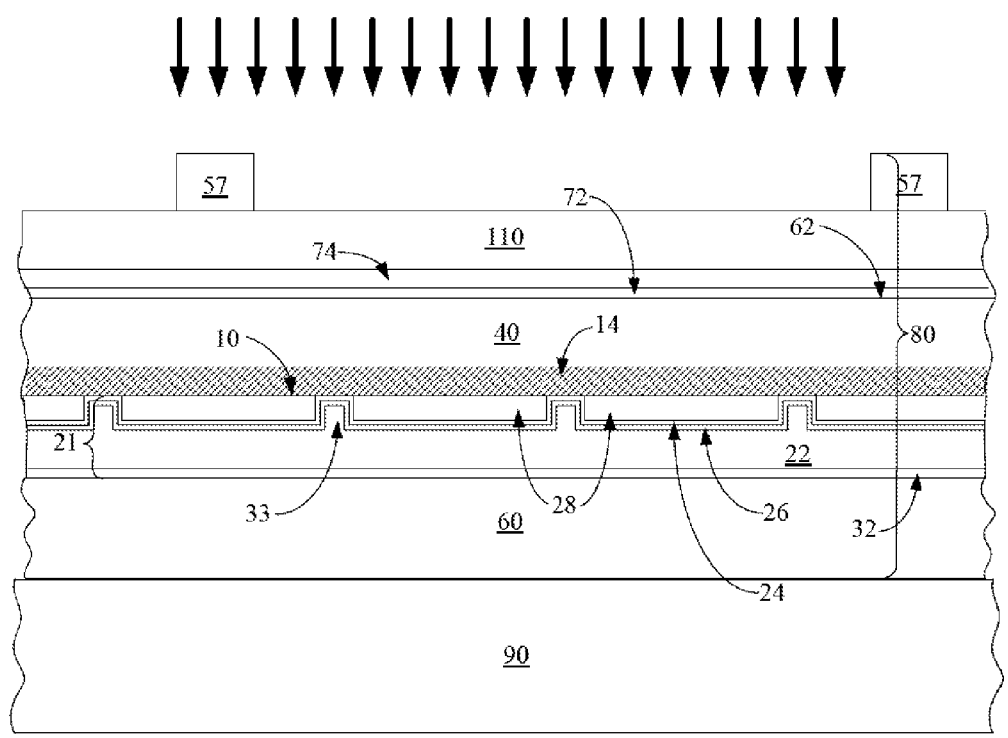

FIG. 3f shows completed photovoltaic assembly 80, which includes a photovoltaic cell and receiver element 60. In alternative embodiments, by changing the dopants used, heavily doped region 14 may serve as the emitter, at first surface 10, while heavily doped silicon layer 74 serves as a contact to the base region. Incident light (indicated by arrows) falls on TCO 110, enters the cell at heavily doped p-type amorphous silicon layer 74, enters lamina 40 at second surface 62, and travels through lamina 40. In this embodiment, receiver element 60 serves as a substrate. If receiver element 60 has, for example, a widest dimension about the same as that of lamina 40, the receiver element 60 and lamina 40, and associated layers, form a photovoltaic assembly 80. Multiple photovoltaic assemblies 80 can be formed and affixed to a supporting substrate 90 or, alternatively, a supporting superstrate (not shown). Fabrication of this cell is described in more detail in Herner, U.S. patent application Ser. No. 12/540,463, "Intermetal Stack for Use in a Photovoltaic Device," filed Aug. 13, 2009, owned by the assignee of the present application and hereby incorporated by reference.

Figure 4:
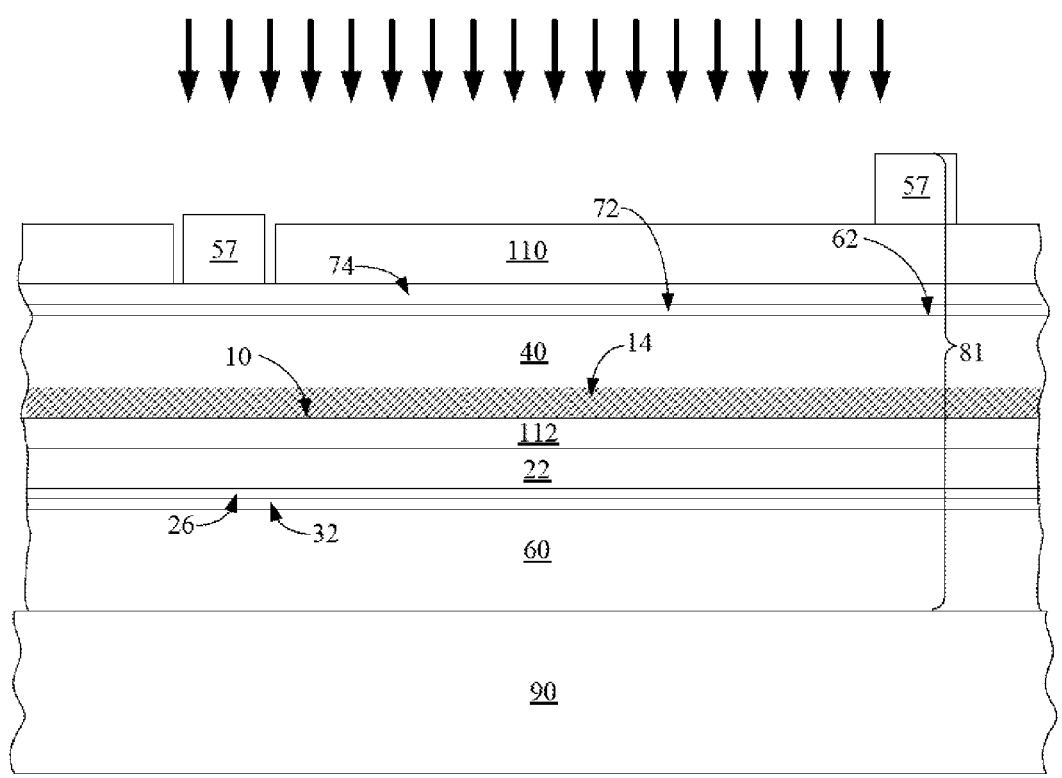
FIG. 4 is a cross-sectional view showing another embodiment of the present invention.

This example was provided for completeness, but the structure and the fabrication process can be varied in many ways. For example, the stack between lamina 40 and receiver element 60 may be the intermetal stack described by Herner et al. in U.S. patent application Ser. No. 12/571,415, "Intermetal Stack For Use In a Photovoltaic Cell," filed Sep. 30, 2009, owned by the assignee of the present invention and hereby incorporated by reference. In this embodiment, shown in FIG. 4, photovoltaic assembly 81 also includes lamina 40 and receiver element 60. The layers between lamina 40 and receiver element 60 may be, for example, TCO layer 112; low-resistance layer 22, which may be nickel; non-reactive barrier layer 26, which may be titanium nitride; and adhesion layer 32, which may be titanium.

Figure 5:
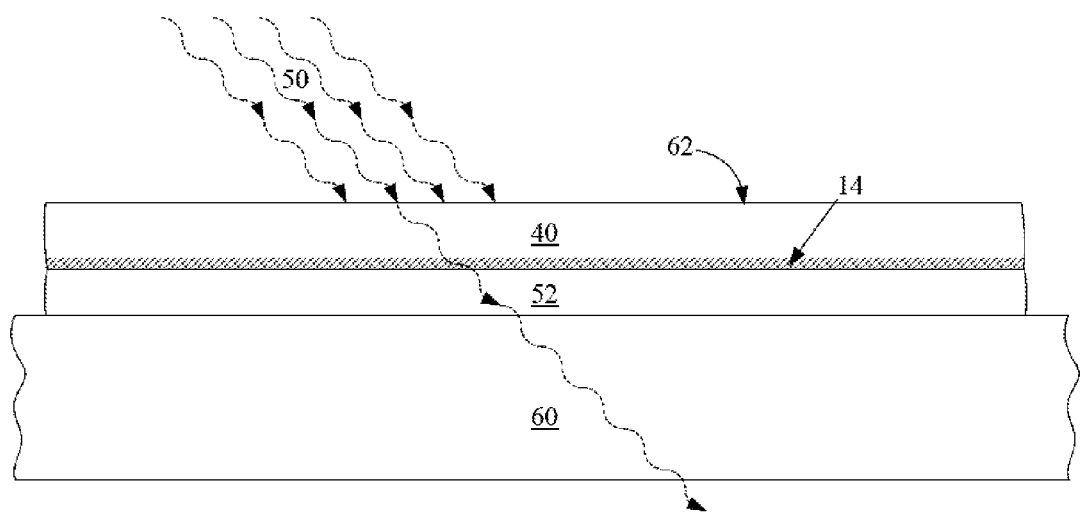
FIG. 5 is a cross-sectional view showing another embodiment of the present invention.

In another alternative embodiment, referring to FIG. 5, receiver element 60 may be composed of a material like glass that is transparent to microwaves, and layers 52 between lamina 40 and receiver element 60 may be of a material, such as a TCO or a dielectric such as silicon dioxide, that is transparent to microwaves. In these embodiments, some portion of incident microwave energy 50 is absorbed by lamina 40.

The microwaves that traverse lamina 40 without being absorbed then pass through the transparent layers 52 and the transparent receiver element 60. As these layers are transparent to microwaves, the microwaves pass through without causing direct heating. In such an embodiment, following completion of fabrication, the structure may be inverted, and receiver element 60 may serve as a superstrate in the completed device.

Microwave annealing may also be performed in many other embodiments, including those described in Sivaram et al., Herner, or Herner et al., earlier incorporated, or, for example, Hilali et al., U.S. patent application Ser. No. 12/189, 158, "Photovoltaic Cell Comprising a Thin Lamina Having a Rear Junction and Method of Making," filed Aug. 10, 2008, owned by the assignee of the present application and hereby incorporated by reference. In some embodiments, receiver element 60 may serve as a superstrate in the completed device.

In other embodiments, a plurality of donor wafers may be affixed to a single receiver element, yielding multiple laminae, which are fabricated into photovoltaic cells as described. The photovoltaic cells may be electrically connected in series, forming a photovoltaic module.

Summarizing, what has been described is a method to form a photovoltaic cell, the method comprising the steps of: defining a cleave plane in a substantially crystalline semiconductor donor wafer; bonding the donor wafer at a first surface to a receiver element; cleaving a substantially crystalline semiconductor lamina from the donor wafer at the cleave plane, wherein the lamina remains bonded to the receiver element at the first surface and a second surface of the lamina is created by cleaving, the second surface opposite the first, and wherein the lamina has a thickness of at least 2 microns; and annealing the entire thickness of the bonded lamina with microwave energy to repair crystalline defects, wherein the lamina is suitable for use in the photovoltaic cell, the photovoltaic cell comprising the lamina.

EXAMPLE

Crystalize Amorphous Layer

Figure 6:
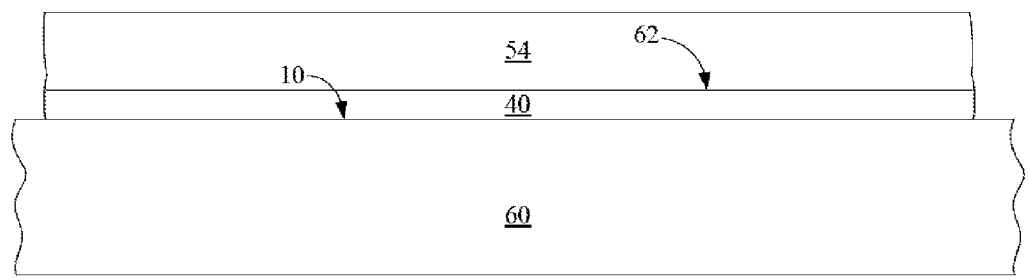
FIG. 6 is a cross-sectional view showing yet another embodiment of the present invention.

In an alternative embodiment, a donor wafer is implanted with, for example, hydrogen and/or helium ions to define a cleave plane, is affixed to a receiver element with zero, one, or more layers intervening, and, referring to FIG. 6, a lamina 40 is cleaved from the donor wafer at the cleave plane, remaining affixed to the receiver element 60. As in prior embodiments, there may be zero, one, or more layers between lamina 40 and receiver element 60, not shown here. The donor wafer, and thus lamina 40, is formed of substantially crystalline semiconductor material, for example monocrystalline, multicrystalline, or polycrystalline silicon.

Following exfoliation and treatment of second surface 62 to remove surface damage, it is possible to add to the thickness of the lamina by depositing a layer 54 of amorphous, nanocrystalline, or microcrystalline semiconductor material such as silicon onto lamina 40. Layer 54 can be a combination of any of these, for example part nanocrystalline and part microcrystalline. Layer 54 can be annealed using microwave energy to increase its degree of crystallinity. After annealing, layer 54 can be, for example, monocrystalline, multicrystalline, or polycrystalline. The same microwave anneal step will also cure crystal defects in lamina 40 caused by the implant step. Layer 54 can be doped during deposition. An amorphous layer can be deposited on top of layer 54 following a microwave anneal, or need not be.

The final cell can be formed in a variety of configurations. The emitter region of the cell, for example, which will be heavily doped to a conductivity type opposite the conductivity type of the base region of the cell, can be formed by doping at first surface 10 of lamina 40, near receiver element 60, before cleaving. Alternatively, layer 54 can initially be lightly doped to a first conductivity type, then, during the final stages of deposition, the last thickness of layer 54 can be heavily doped to the opposite conductivity type, forming the emitter. In still another alternative, Layer 54 can be lightly doped to a first conductivity type and subjected to microwave anneal. Following microwave anneal, an amorphous layer heavily doped to the opposite conductivity type can be deposited on layer 54, forming the emitter. Other configurations can be imagined.

Fabrication continues to complete a photovoltaic cell comprising lamina 40 and receiver element 60, as described earlier.

EXAMPLE

Activate Dopants

Other embodiments may include a shallow junction formed at the cleaved surface, as described by Hilali et al., U.S. patent application Ser. No. 12/399,065, "Photovoltaic Cell Comprising an MIS-Type Tunnel Diode," filed Mar. 6, 2009, owned by the assignee of the present application and hereby incorporated by reference.

Figure 7:
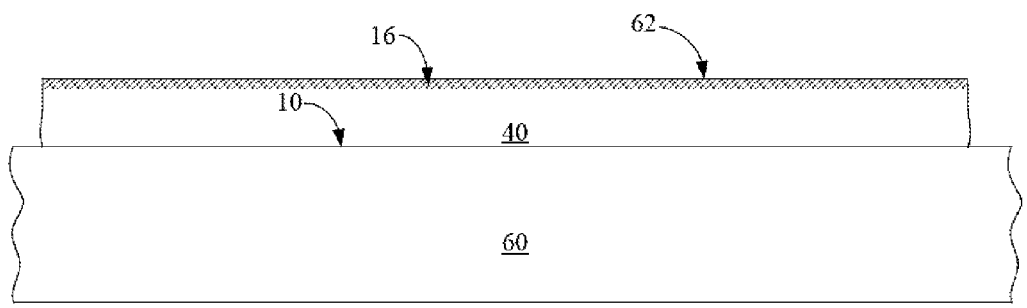
FIG. 7 is a cross-sectional view showing still another embodiment of the present invention.

Such a shallow junction can be formed using a microwave anneal. Referring to FIG. 7, following formation of lamina 40 affixed to receiver element 60 (interposed layers, if any, are not shown), and treatment of second surface 62 to remove surface damage, a spin-on or spray-on dopant can be formed on second surface 62, including an n-type or p-type dopant, or a dopant may be provided by shallow ion implantation. A microwave anneal drives the dopant into second surface 62 of lamina 40 and activates it, forming shallow doped region 16. Fabrication continues to form a photovoltaic cell, as described by Hilali et al.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to form a photovoltaic cell, the method comprising the steps of:
   providing a semiconductor lamina bonded to a receiver element, the lamina having a first surface and a second surface opposite the first, the thickness between the first surface and the second surface between about 1.5 microns and about 10 microns,
   wherein the lamina is bonded to the receiver element at the first surface, with zero, one, or more layers intervening, and the second surface is exposed, and
   wherein the receiver element has a thickness of at least 80 microns; and
   annealing the entire thickness of the bonded lamina with microwave energy,
   wherein the lamina is suitable for use in the photovoltaic cell, and
   wherein the photovoltaic cell comprises the lamina.

2. The method of claim 1 further comprising the step of fabricating the photovoltaic cell.

3. The method of claim 1 wherein the semiconductor lamina is substantially crystalline.

4. The method of claim 1 wherein the receiver element comprises glass, metal, polymer, ceramic, or semiconductor material.

5. The method of claim 4 wherein the receiver element comprises glass.

6. The method of claim 1 wherein a metal layer is disposed between the lamina and the receiver element.

7. The method of claim 6 wherein, during the annealing step, microwave energy enters the lamina at the second surface and is reflected from the metal layer.

8. The method of claim 6 wherein a transparent conductive oxide layer is energy enters the lamina at the second surface and is absorbed at a depth of at least 2 disposed between the lamina and the metal layer.

9. The method of claim 1 wherein, during the annealing step, microwave microns beneath the second surface.

10. The method of claim 1 wherein, during the annealing step, microwave energy enters the lamina at the second surface and is absorbed at a depth of at least 4 microns beneath the second surface.

11. The method of claim 1 wherein the power of the microwave energy during the anneal step is between about 500 watts and about 5000 watts.

12. The method of claim 1 wherein, before the annealing step, the lamina is substantially monocrystalline silicon.

13. The method of claim 1 wherein, before the annealing step, the lamina includes an amorphous silicon, nanocrystalline, or microcrystalline silicon layer.

14. A method to form a photovoltaic cell, the method comprising the steps of: defining a cleave plane in a substantially crystalline semiconductor donor wafer;
   bonding the donor wafer at a first surface to a receiver element;
   cleaving a substantially crystalline semiconductor lamina from the donor wafer at the cleave plane, wherein the lamina remains bonded to the receiver element at the first surface and a second surface of the lamina is created by cleaving, the second surface opposite the first, and wherein the lamina has a thickness of at least 2 microns; and
   annealing the entire thickness of the bonded lamina with microwave energy to repair crystalline defects,
   wherein the lamina is suitable for use in the photovoltaic cell, the photovoltaic cell comprising the lamina.

15. The method of claim 14 further comprising fabricating the photovoltaic cell.

16. The method of claim 14 wherein the receiver element comprises glass, metal, polymer, ceramic, or semiconductor material.

17. The method of claim 16 wherein the receiver element comprises glass.

18. The method of claim 14 wherein a metal layer is disposed between the lamina and the receiver element.

19. The method of claim 18 wherein, during the annealing step, microwave energy enters the lamina at the second surface and is reflected from the metal layer.

20. The method of claim 18 wherein a transparent conductive oxide is disposed between the lamina and the metal layer.

21. The method of claim 14 wherein the donor wafer is monocrystalline silicon.

22. The method of claim 14 wherein, during the bonding step, zero, one, or more layers are disposed between the donor wafer and the receiver element.

23. The method of claim 14 further comprising, before the annealing step, etching at the second surface to remove exfoliation damage.

* * * * *

UNITED STATES PATENT AND TRADEMARK OFFICE
CERTIFICATE OF CORRECTION

| | | |
|---|---|---|
| PATENT NO. | : 8,257,995 B2 | Page 1 of 1 |
| APPLICATION NO. | : 12/636704 | |
| DATED | : September 4, 2012 | |
| INVENTOR(S) | : Hilali et al. | |

It is certified that error appears in the above-identified patent and that said Letters Patent is hereby corrected as shown below:

In column 12, line 8, claim 8, please make the following deletion in claim 8:

8. The method of claim 6 wherein a transparent conductive oxide layer is "energy enters the lamina at the second surface and is absorbed at a depth of at least 2" disposed between the lamina and the metal layer.

In column 12, line 12, claim 9, please make the following insertion in claim 9:

9. The method of claim 1 wherein, during the annealing step, microwave --energy enters the lamina at the second surface and is absorbed at a depth of at least 2-- microns beneath the second surface.

Signed and Sealed this
Twenty-third Day of October, 2012

David J. Kappos
*Director of the United States Patent and Trademark Office*